US008880574B2

(12) United States Patent
Rivoir

(10) Patent No.: US 8,880,574 B2
(45) Date of Patent: Nov. 4, 2014

(54) STATE MACHINE AND GENERATOR FOR GENERATING A DESCRIPTION OF A STATE MACHINE FEEDBACK FUNCTION

(75) Inventor: Jochen Rivoir, Magstadt (DE)

(73) Assignee: Advantest (Singapore) Pte Ltd, Singapore (SG)

( * ) Notice: Subject to any disclaimer, the term of this patent is extended or adjusted under 35 U.S.C. 154(b) by 592 days.

(21) Appl. No.: 13/120,914

(22) PCT Filed: Sep. 24, 2008

(86) PCT No.: PCT/EP2008/008088
§ 371 (c)(1),
(2), (4) Date: Jun. 7, 2011

(87) PCT Pub. No.: WO2010/034326
PCT Pub. Date: Apr. 1, 2010

(65) Prior Publication Data
US 2011/0231464 A1  Sep. 22, 2011

(51) Int. Cl.
*G06F 7/38* (2006.01)
*H03K 3/84* (2006.01)
*G06F 7/58* (2006.01)

(52) U.S. Cl.
CPC  *H03K 3/84* (2013.01); *G06F 7/584* (2013.01); *G06F 2207/582* (2013.01); *G06F 2207/581* (2013.01)
USPC ............................ 708/232; 708/250; 708/254

(58) Field of Classification Search
None
See application file for complete search history.

(56) References Cited

U.S. PATENT DOCUMENTS

| 4,488,229 A * | 12/1984 | Harrison .......................... 326/40 |
| 6,314,440 B1 * | 11/2001 | O'Toole et al. ................ 708/250 |
| 7,827,223 B2 * | 11/2010 | Gressel et al. ................. 708/250 |
| 2007/0244950 A1 * | 10/2007 | Golic ............................. 708/250 |

FOREIGN PATENT DOCUMENTS

| EP | 0955734 A2 | 11/1999 |
| EP | 1182813 A1 | 2/2002 |
| GB | 2291234 A | 1/1996 |
| TW | 200817857 A | 4/2008 |
| TW | 200820146 A | 5/2008 |
| WO | 9613902 A1 | 5/1996 |

OTHER PUBLICATIONS

Konstantoulakis, G.E., et al., "Transfer of Data over ATM Networks Using Available Bit Rate (ABR)", Proc. IEEE Symposium on Computers and Communications, pp. 2-8, Los Alamitos, Jul. 1995.
Carneiro, C.A., et al., "A Real-Time and Parametric Parallel Video Compression Architecture Using FPGA", Lecture Notes in Computer Science, 4331, pp. 758-768.

* cited by examiner

Primary Examiner — Michael D Yaary

(57) ABSTRACT

An embodiment of a state machine for generating a pseudo-random word stream, each word of the word stream including a plurality of subsequent bits of a pseudo-random bit sequence includes a plurality of clock registers and a feedback circuit coupled to the registers and adapted to provide a plurality of feedback signals to the registers based on a feedback function and a plurality of register output signals of the registers, wherein the state machine is configured such that a first word defined by the plurality of register output signals includes a first set of subsequent bits of a pseudo-random bit stream and such that a subsequent second word defined by the plurality of register output signals includes a second set of subsequent bits of a pseudo-random bit stream.

23 Claims, 8 Drawing Sheets

STATE MACHINE AND GENERATOR FOR GENERATING A DESCRIPTION OF A STATE MACHINE FEEDBACK FUNCTION

Embodiments according to the present invention relate to state machines, generators for generating a description of a state machine feedback function, methods for generating pseudo-random word stream, methods for generating a description of a state machine feedback function and a system for generating a pseudo-random word stream, which may be applied in a wide field of applications.

BACKGROUND OF THE INVENTION

Random numbers or pseudo-random numbers may be used in a wide field of applications in modern technology, for instance, in the field of cryptography, numerical simulation and the generation of noise signals, to name but a few. Random numbers or pseudo-random numbers may technically be generated by a true random number generator or a pseudo-random number generator, respectively.

While a true pseudo-random number generator typically employs physical, real source of randomness, a pseudo-random number generator typically does not employ an element showing a statistical true randomness. Examples of such elements are, for instance, electric resistors with Nyquist noise, electrical tunneling elements or elements based on radio active decay with a shot noise behavior or closed feedback loops employing the feedback signal as the noise source to name but a few.

In contrast pseudo-random number generators typically do not employ such elements of true randomness but are based on a deterministic behavior such that the numbers generated by a pseudo-random number generator are not true random numbers.

Thus, true random number generators and pseudo-random number generators are utilized whenever a random or pseudo-random value is important or advisable to be used in a field of application. The above-mentioned examples are a mere scratch at the surface of possible applications.

Pseudo-random number generators, compared to true random number generators, typically allow a faster generation of the numbers, are very often more easily to implement and show a lower energy consumption than corresponding true random number generators. However, it should be kept in mind that the pseudo-random number generators are deterministic systems. As a consequence, the generated numbers may be calculated based on the knowledge of the inner structure of a pseudo-random number generator and the knowledge of a state of it. This may be a disadvantage under some circumstances and a desired and wanted consequence under other circumstances, when, for instance, a periodic behavior or reproducibility may be important in some applications.

In digital implementations or applications the pseudo-random numbers generated by a pseudo-random number generator typically comprise digital or binary units. Depending on the concrete implementation, a pseudo-random number generator may, in such a case, provide a pseudo-random bit stream (PRBS) comprising a sequence of individual bits or a pseudo-random word stream (PRWS) comprising a sequence of words. Each word typically comprises a plurality of bits, e.g. 4 bits, 6 bits, 8 bits, 16 bits, 32 bits or the like. In other words, a word of a word stream typically comprises a plurality of bits and the word may be considered as a part of a sequence of pseudo-random bits. Therefore, in many applications, a pseudo-random bit stream and a pseudo-random word stream may be derived from each other.

Due to the ever increasing operational speeds and frequencies of circuits, computer systems and other devices, a demand for a faster generation of pseudo-random bit streams and word streams with a sufficiently good statistical distribution concerning randomness of the bits exists, for instance, to allow faster processing speeds of numerical simulations, cryptographic applications, generation of noise signals or other data, information and signals depending on the application in mind. To generate, for instance, the pseudo-random word stream at a speed of 1 GHz, with each word comprising 4 bits entails a generation of 4 gigabits per second (Gbps) which may represent a high technical challenge.

SUMMARY

According to an embodiment, a state machine for generating a pseudo-random word stream, each word of the word stream including a plurality of subsequent bits of a pseudo-random bit sequence, may have: a plurality of clocked registers, the registers including corresponding inputs and corresponding outputs; and a feedback circuit coupled to the inputs and to the outputs of the registers and adapted to provide a plurality of feedback signals to the inputs of the registers based on a feedback function and the plurality of register output signals of the registers, the register output signals being indicative of states of the registers, wherein the state machine is configured such that a first word defined by the plurality of register output signals includes a first set of subsequent bits of the pseudo-random bit stream and such that a subsequent second word defined by the plurality of register output signals includes a second set of subsequent bits of the pseudo-random bit stream; wherein the feedback circuit includes a logic stage and an adder; wherein the logic stage is configured to provide a plurality of logic stage output signals on the basis of the output signals of the registers by selectively weighing the output signals of the registers depending on a set of multi-transmission matrix elements; wherein the logic stage includes a masking gate configured to provide a logic stage output signal depending on an output signal of one of the registers and one of the multi-transition matrix elements; wherein the adder is configured to provide at least one feedback signal using a modulo-2 summation of the logic stage output signals; and wherein the adder includes a plurality of XOR-gates or XNOR-gates for the modulo-2 summation.

According to another embodiment, a method for generating a pseudo-random word stream, each word of the word stream including a plurality of subsequent bits of a pseudo-random sequence, may have the steps of: outputting a first word defined by a plurality of states including a first set of subsequent bits of the pseudo-random bit stream; altering the plurality of states based on a feedback function and the plurality of states to acquire new states based on selectively weighing the states of the registers depending on a set of multi-transmission matrix elements and based on a modulo-2 summation using a plurality of XOR-gates or XNOR-gates for the modulo-2 summation; and outputting a subsequent second word defined by the new states including a second set of subsequent bits of the pseudo-random bit stream.

According to another embodiment, a generator for generating a description of a state machine feedback function on the basis of a set of generator polynomial coefficients defining a configuration of a linear feedback shift register, may have: a calculator configured to calculate the description of the state machine feedback function for a state machine on the basis of the set of generator polynomial coefficients, wherein the calculator is configured to determine the feedback function such that a state transition between immediately subsequent states of the state machine defined by the feedback function corresponds to a sequence of state transitions of a linear feedback shift register, the linear feedback shift register being configured in accordance with the generator polynomial coefficients; wherein the calculator is configured to acquire, as an intermediate result, a single transition matrix description of a state machine feedback function on the basis of the generator polynomial coefficients of the linear feedback shift register, the single transition matrix description describing a relationship between an initial state of a state machine and a consecutive state of the state machine according to the generator polynomial coefficients for a single linear feedback shift register state transition; wherein the calculator is configured to compute a power of the single transition matrix description to acquire, as the state machine feedback function, a multi-transition matrix description describing, in a combined form, a plurality of linear feedback shift register state transitions; and wherein the calculator is adapted to calculate the multi-transition matrix description A including the multi-transition matrix elements $A_{ij}$ based on the equation $A=T^K \mod 2$ wherein T is the single transition matrix description including the single transition matrix elements $T_{ij}$, wherein i is a row index in the range between 1 and G, wherein j is a column index in the range between 1 and G, wherein N is a number of registers of the linear feedback shift register (100), wherein R is an integer larger than N, wherein G is an integer larger than or equal to a maximum of N and R, wherein $T_{1j}$ for j in the range between and N is equal to the set of generator polynomial coefficients (310), wherein $T_{ij}$ for i=j+1 and j in the range between 1 and (G−1) is equal to 1, and wherein $T_{ij}$ is equal to 0.

According to another embodiment, a method for generating a description of a state machine feedback function on the basis of a set of generator polynomial coefficients defining a configuration of a linear feedback shift register may have the steps of: calculating the description of the state machine feedback function for a state machine on the basis of the set of generator polynomial coefficients such that a state transition between immediately subsequent states of the state machine defined by the feedback function corresponds to a sequence of state transitions of the linear feedback shift register configured in accordance with a generator polynomial coefficients wherein calculating the description includes generating a set of parameter coefficients $A_{ij}$ such that $A=T^K \mod 2$, wherein $A_{ij}$ are elements of the matrix A, wherein T is a matrix including elements $T_{ij}$, wherein i is a row index in the range between 1 and G, wherein j is a column index in the range between 1 and G, wherein G is an integer larger than or equal to a maximum of N and R, wherein $A_{1j}$ for j in the range between 1 and N is given by the set of generator polynomial coefficients (310), wherein $T_{ij}$ for i=j+1 and j in the range between 1 and (G−1) is equal to 1, wherein $T_{ij}$ is else equal to 0.

According to another embodiment, a state machine for generating a pseudo-random word stream, each word of the word stream including a plurality of subsequent bits of a pseudo-random bit sequence, may have: a plurality of clocked registers, the registers including corresponding inputs and corresponding outputs; and a feedback circuit coupled to the inputs and to the outputs of the registers and adapted to provide a plurality of feedback signals to the inputs of the registers based on a feedback function and the plurality of register output signals of the registers, the register output signals being indicative of states of the registers, wherein the state machine is configured such that a first word defined by the plurality of register output signals includes a first set of subsequent bits of the pseudo-random bit stream and such that a subsequent second word defined by the plurality of register output signals includes a second set of subsequent bits of the pseudo-random bit stream; wherein the feedback circuit is adapted such that the plurality of feedback signals provided to the inputs of the registers are based on a single application of the feedback function leading to new states of the registers, the new states representing a state of a linear feedback shift register initialized with the original states of the registers after being clocked multiple times; and wherein the feedback function includes a set of parameter coefficients $A_{ij}$ such that $A=T^K \mod 2$, wherein $A_{ij}$ are elements of the matrix A, wherein T is a matrix including elements $T_{ij}$, wherein i is a row index in the range between 1 and G, wherein j is a column index in the range between 1 and G, wherein G is an integer larger than or equal to a maximum of N and R, wherein $A_{1j}$ for j in the range between 1 and N is given by the set of generator polynomial coefficients (310), wherein $T_{ij}$ for i=j+1 and j in the range between 1 and (G−1) is equal to 1, wherein $T_{ij}$ is else equal to 0.

According to another embodiment, a method for generating a pseudo-random word stream using a state machine, each word z(k) of the word stream including R bits, based on a set of parameter coefficients $A_{ij}$ according to $A=T^K \mod 2$, wherein $A_{ij}$ are elements of a matrix A, wherein T is a matrix including elements $T_{ij}$, wherein i is a row index in the range between 1 and G, wherein j is a column index in the range between 1 and G, wherein G is an integer larger than or equal to a maximum of N and R, wherein $A_{ij}$ for j in the range between 1 and N is given by a set of generator polynomial coefficients including N bits indicative of a feedback polynomial, wherein N is an integer larger than 1, wherein R is a positive integer larger than N; wherein $T_{ij}$ for i=j+1 and j in the range between 1 and (G−1) is equal to 1, wherein $T_{ij}$ is else equal to 0, may have the steps of: generating the word z(k) in a plurality of clocked registers by providing feedback signals from a feedback circuit to inputs of the clocked registers such that $z(k+1)=A \cdot z(k) \mod 2$, wherein $z_i(k)$ is a vector element of the word z(k) in the form of a vector, wherein k is a time index.

According to another embodiment, a state machine for generating a pseudo-random word stream, each word of the word stream including a plurality of subsequent bits of a pseudo-random bit sequence, may have: a plurality of clocked registers, the registers including corresponding inputs and corresponding outputs; a feedback circuit coupled to the inputs and to the outputs of the registers and adapted to provide a plurality of feedback signals to the inputs of the registers based on a feedback function and the plurality of register output signals of the registers, the register output signals being indicative of states of the registers, wherein the state machine is configured such that a first word defined by the plurality of register output signals includes a first set of subsequent bits of the pseudo-random bit stream and such that a subsequent second word defined by the plurality of register output signals includes a second set of subsequent bits of the pseudo-random bit stream; and a circuit to provide a word of the pseudo-random bit stream in a sequentially encoded form.

According to another embodiment, a method for generating a pseudo-random word stream, each word of the word stream including a plurality of subsequent bits of a pseudo-random bit sequence may have the steps of: providing a first word defined by a plurality of states including a first set of subsequent bits of the pseudo-random bit stream; altering the plurality of states based on a feedback function and the plurality of states to acquire new states; providing a subsequent second word defined by the new states including a second set of subsequent bits of the pseudo-random bit stream; and providing a word of the word stream in a sequentially encoded form.

According to another embodiment, a system for generating a pseudo-random word stream, each word of the word stream including a plurality of subsequent bits of a pseudo-random bit sequence, may have: a state machine according to any of the claims 1, 19 and 21; and a generator for generating a description of a state machine feedback function on the basis of a set of generator polynomial coefficients defining a configuration of a linear feedback shift register, which generator may have: a calculator configured to calculate the description of the state machine feedback function for a state machine on the basis of the set of generator polynomial coefficients, wherein the calculator is configured to determine the feedback function such that a state transition between immediately subsequent states of the state machine defined by the feedback function corresponds to a sequence of state transitions of a linear feedback shift register, the linear feedback shift register being configured in accordance with the generator polynomial coefficients; wherein the calculator is configured to acquire, as an intermediate result, a single transition matrix description of a state machine feedback function on the basis of the generator polynomial coefficients of the linear feedback shift register, the single transition matrix description describing a relationship between an initial state of a state machine and a consecutive state of the state machine according to the generator polynomial coefficients for a single linear feedback shift register state transition; wherein the calculator is configured to compute a power of the single transition matrix description to acquire, as the state machine feedback function, a multi-transition matrix description describing, in a combined form, a plurality of linear feedback shift register state transitions; and wherein the calculator is adapted to calculate the multi-transition matrix description A including the multi-transition matrix elements $A_{ij}$ based on the equation $A=T^R$ mod 2 wherein T is the single transition matrix description including the single transition matrix elements $T_{ij}$, wherein i is a row index in the range between 1 and G, wherein j is a column index in the range between 1 and G, wherein N is a number of registers of the linear feedback shift register (100), wherein R is an integer larger than N, wherein G is an integer larger than or equal to a maximum of N and R, wherein for j in the range between 1 and N is equal to the set of generator polynomial coefficients (310), wherein $T_{ij}$ for i=j+1 and j in the range between 1 and (G−1) is equal to 1, and wherein $T_{ij}$ is equal to 0, wherein the feedback circuit of the state machine is adapted such that the feedback signals are provided based on the description of the state machine feedback function calculated by the generator.

Another embodiment may have a computer program for performing, when running on a processor, a method according to any of the claims 11, 18, 20 and 22.

BRIEF DESCRIPTION OF THE DRAWINGS

Embodiments of the present invention will be detailed subsequently referring to the appended drawings, in which:

FIG. 4 illustrates a matrix description of the LFSR of FIG. 1a;

FIG. 8 illustrates a comparison of the results of the LFSR of FIG. 1a and a corresponding state machine according to an embodiment of the present invention.

DETAILED DESCRIPTION OF THE INVENTION

Figure 1A:
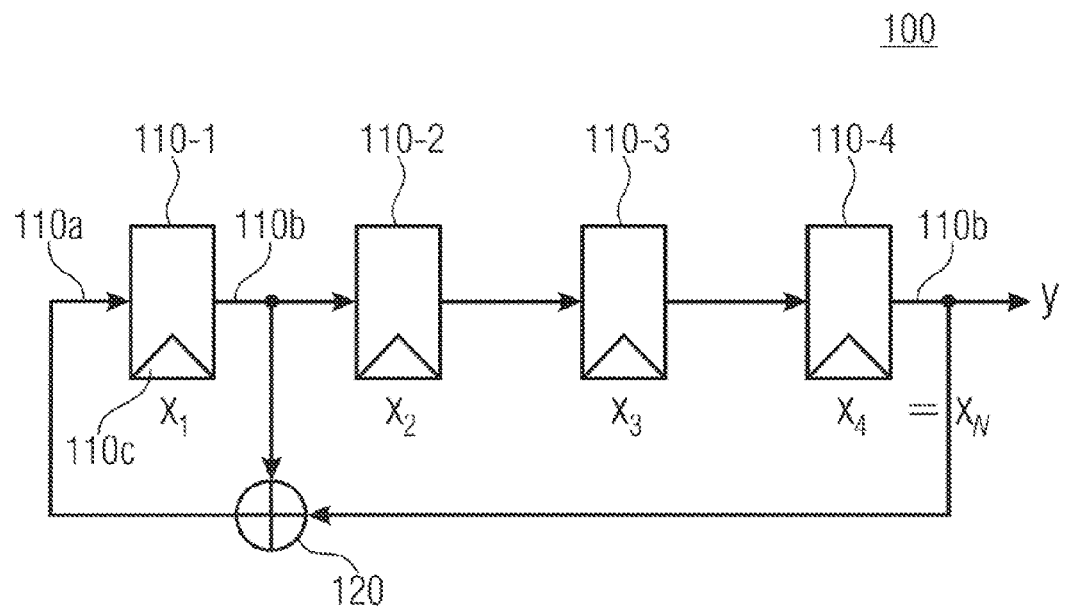
FIG. 1a shows an implementation of a linear feedback shift register (LFSR) with 4 bits.

Before embodiments according to the present invention will be described with reference to FIGS. 2 to 8, a conventional pseudo-random number generator in the form of a linear feedback shift register (LFSR) will be described first to outline the basic principles and implementation details of a pseudo-random number generator.

As mentioned above, a main difference between a true pseudo-random generator (TRNG) and a pseudo-random number generator (PRNG) is that the latter typically does not involve an element offering the possibility to access a real physical or statistical random distribution. A pseudo-random number generator is, therefore, typically a deterministic system which allows a calculation of the pseudo-random bits or words and the corresponding states of the LFSR based on the knowledge of the internal structure of the LFSR and an initial state.

This lack of true randomness may have under some circumstances a negative effect and under some circumstances a positive effect, when, for instance, a periodic behavior or a reproducibility is wanted or desired. For instance, it may be interesting to generate a deterministic bit stream comprising a known number of words with a known number of ones and zeroes. For instance, it may be favorable to generate a periodic pseudo-random word stream comprising a known number of words having (N−1) ones and a known number of words having (N−1) zeroes, where N is the length of each of the words.

It is also often accompanied by the possibility of a faster and less energy consuming generation of (pseudo-) random numbers compared to a true pseudo-random number generator. Furthermore, a pseudo-random number generator is in many cases easier to implement since an implementation is mainly based on arithmetic or logical calculations compared to an implementation of an element offering access to an effect with a true random statistic. Not only due to these possible advantages of pseudo-random number generators, they are widely employed in many fields of applications where a (pseudo-) random number may be generated.

A pseudo-random number generator may conventionally be implemented as a linear feedback shift register (LFSR), which will be described in more detail for a (LFSR) with N=4 registers in the context of FIG. 1a. A linear feedback shift register comprises a cascade of simultaneously or parallel clock registers of which the first is provided with a feedback signal based on one or more states of the registers. When more than one state of the registers is used for the generation of the feedback signal for the first register typically a XOR logic gate (XOR=exclusive OR) is used. Since all these electrical elements can easily be implemented in hardware, linear feedback shift registers may easily be implemented and realized in hardware.

Depending on the feedback signal provided to the first register, linear feedback shift registers are capable of generating a pseudo-random bit stream or pseudo-random word stream with statistical properties well enough even for cryptographic applications. This is for instance true, when the feedback signal for the first register is based on a feedback function or tap sequence which corresponds to a primitive polynomial. This, however, will be described in more detail in context with FIGS. 4, 5 and 8.

FIG. 1 shows an example of a LFSR 100 with N registers 110. To be more precise, the LFSR 100 of FIG. 1a comprises N=4 registers 110-1, 110-2, 110-3, 110-4. Each of the registers comprises an input 110a, an output 110b and a clock signal input 110c, which are only labeled for the first register 110-1 for the sake of simplicity and clearness of the presentation of FIG. 1a.

The four registers 110-1, 110-2, 110-3 and 110-4 are connected to form a daisy chain such that, apart from the last 110-4, the outputs 110b of the registers 110 are coupled to the inputs 110a of the immediately following or consecutive register 110. In other words, the output 110b of the first register 110-1 is coupled to the input 110a (not labeled in FIG. 1a) of the second register 110-2. Accordingly, also the outputs of the second and third register 110-2, 110-3 are coupled to the inputs of the third and fourth register 110-3, 110-4 respectively.

The input 110a of the first register 110-1 is coupled to an output of a XOR gate 120, which comprises two inputs coupled to the output 110b of the first register 110-1 and to the output 110b of the fourth register 110-4, respectively. The XOR gate 120 has generated the feedback signal provided to the input 110a of the first register 110-1 based on an exclusive or combination of the states of the first and the fourth registers 110-1, 110-4.

An output of the linear feedback shift register 100 represents the output 110b of the fourth register 110-4 at which the current state $x_4=x_N$ is generated as the pseudo-random bit y.

In FIG. 1a the connection of the clock signal inputs 110c of the four registers 110 have been omitted for the sake of clarity. The clock signal inputs 110 may be connected in parallel to an input for the clock signal of the linear feedback shift register 100.

Since the registers 110 of the linear feedback shift register 100 shown in FIG. 1a are adapted to store two states and are adapted to acquire a state in response to a signal present at the respective inputs 110a and an appropriate clock signal present at the clock signal 110c, one bit of a pseudo-random bit stream is generated for each clock cycle of a clock signal presented to the linear feedback shift register 100. Since at their respective outputs 110b a signal indicative of the present state of the register 110 is available, a pseudo-random bit stream or pseudo-random bit sequence $\{y(0), y(1), \ldots, y(L)\}$ will be present at the output of the linear feedback shift register 100.

The linear feedback shift register 100 shown in FIG. 1a is described by generating characteristic polynomial g(x), which defines the tab sequence of feedback tabs. The characteristic polynomial g(x) of the feedback function for the linear feedback shift register 100 of FIG. 1a is given by $$g(x)=1+x+x^4, \tag{1}$$

which indicates that the output of the first register 110-1 (summand $x=x^1$) and the output of the fourth register 110-4 (summand $x^4$) are used.

In other words, an equivalence between the characteristic polynomial g(x) and an implementation of a linear feedback shift register 100 exists, which can be described by summing the outputs of all registers with the corresponding number represented as the power of the summand of x. Typically, an additional summand 1 is also added indicating the feedback.

The LFSR 100 shown in FIG. 1a comprises N=4 registers 110 so that it can acquire $2^N=2^4=16$ different states 0000, 0001, ..., 1111. Since the LFSR 100 initialized with a state 0000 leads to a feedback signal provided to the input 110a of the first register 110-1, which is equal to 0, no change of the states of the registers of the LFSR 100 will occur. Hence, the state 0000 will not lead to any change of the states of the LFSR 100. The maximum sequence length of a pseudo-random bit stream generated by the LFSR 100 is $2^N-1$ which will be acquired only for so-called primitive characteristic polynomials. Embodiments according to the present invention, are neither limited to primitive polynomials nor to non-primitive polynomials, as will be outlined in more detail below.

Due to the daisy chain configuration or series connection of the registers 110, the next N−1 bits of the pseudo-random bit stream are the current states $x_{N-1}(k), \ldots, x_1(k)$ of the registers 110-3, ..., 110-1.

The linear feedback shift register 100 shown in FIG. 1a represents a straightforward implementation of a pseudo-random bit stream generation. However, the linear feedback shift register 100 as shown in FIG. 1a can also be used to generate a pseudo-random word stream. While a pseudo-random bit stream comprises a sequence of single bits, a pseudo-random word stream comprises a sequence of words of, for instance, 4 bits, 6 bits, 8 bits, 16 bits, 32 bits or the like. Hence, a word comprises a plurality of bits or a part of a sequence of pseudo-random bits. This essentially means that a pseudo-random bit stream and a pseudo-random word stream may be, under some circumstances, transferred into one another. An example for such a transferal is described in context of FIG. 1b.

Figure 1B:
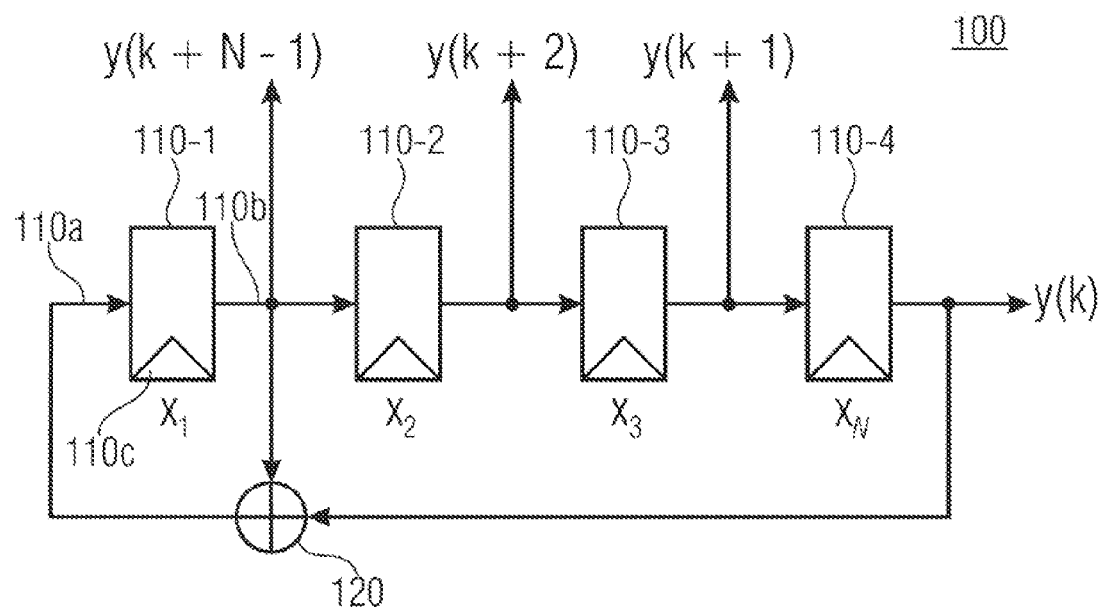
FIG. 1b shows the LFSR of FIG. 1a in a parallel read-out mode of operation.

FIG. 1b shows, the linear feedback shift register 100 shown in FIG. 1a in a configuration for generating a pseudo-random word stream instead of a pseudo-random bit stream. To achieve this, the linear feedback shift register 100 of FIG. 1b differs from that of FIG. 1a only with respect to the configuration of the output of the linear feedback shift register 100. While in the case of the LFSR 100 of FIG. 1a the output of the LFSR mainly represents the output 110b of the fourth register 110-4, the output of the LFSR 100 of FIG. 1b is coupled to all outputs of the four registers 110-1, ..., 110-4. The output of the LFSR 100 provides as bit y (k) the signal present at the output of the register 110-4, as bit k+1 the signal present at the output of third register 110-3, as bit k+2 the signal present at the output of the second register 110-2 and as bit k+N−1=k+3 the output of the first register 110-1.

The LFSR 100 of FIG. 1b produces the same pseudo-random bit sequence or pseudo-random bit stream as the LFSR 100 of FIG. 1a by the previously described parallel read-out the N=4 registers and afterwards clocking the LFSR N=4 times, while the output during these clocking sequences is ignored. Naturally, the LFSR 100 as shown in FIG. 1b cannot only be used to obtain pseudo-random words with N bits each but any number of bits R being smaller than or equal to the number of registers N of the LFSR 100. In this case, the parallel read-out may be limited to R stages and a subsequent clocking of the LFSR 100 R times, while ignoring the output during these intermediate clockings.

Naturally, as indicated earlier, different feedback functions than the one as defined by the characteristic polynomial g(x) occurring to equation (1) may be implemented. Also, longer or shorter linear feedback shift registers 100 with a different number of registers N may be implemented. Also the clock signal provided to the clock signal input 100c of the registers 110 may optionally be generated inside the LFSR 100 instead of being provided externally.

The pseudo-random number generators 100 in the form of the linear feedback shirt registers 100 as depicted in FIGS. 1a and 1b are, however, comparably slow in the case of generating pseudo-random words for a pseudo-random word stream, wherein each word comprises more than one bit. In these cases the linear feedback shift register 100 may be clocked multiple times in the case of a sequential readout of a pseudo-random bit stream as illustrated in FIG. 1a as well as in the case of a parallel readout as indicated in FIG. 1b. In other words, the generation of pseudo-random words for words comprising R bits (R≤N) may use R clock cycles of a clock signal provided to the registers 110. The clock signal provided to the LFSR 100 may have a frequency of R-times that of a desired pseudo-random word stream.

However, apart from the previously described drawback of the comparably slow generation of pseudo-random words, a linear feedback shift register offers a statistically well distributed pseudo-random bit stream, especially when operated based on a primitive polynomial. Hence, a demand exists to generate a pseudo-random word stream with a comparable level of quality concerning the statistical distribution of pseudo-random bits of a LFSR faster.

Figure 2:
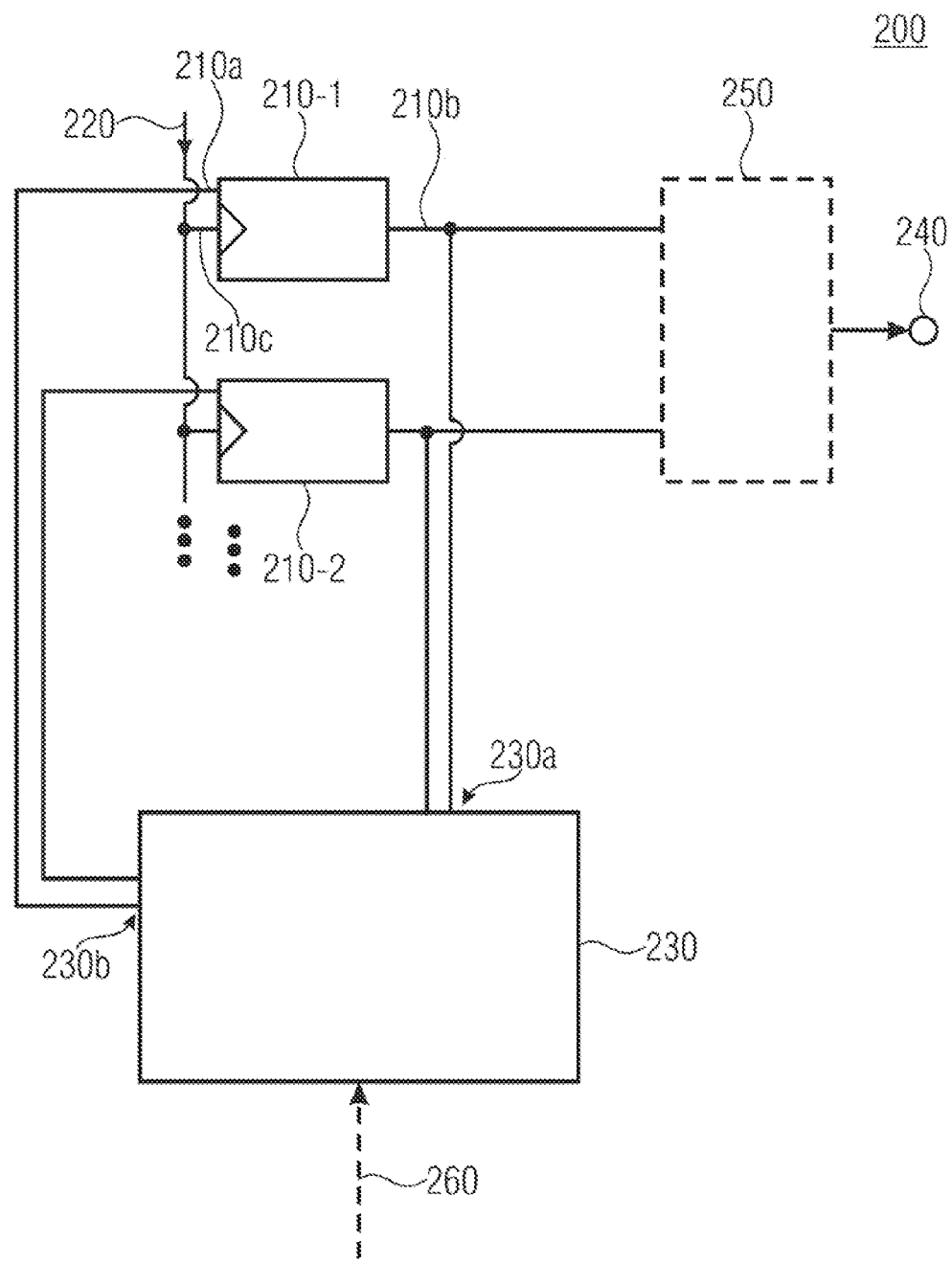
FIG. 2 shows a state machine according to an embodiment of the present invention.

FIG. 2 shows a block diagram of a state machine 200 according to an embodiment of the present invention. The state machine 200 comprises a plurality of clocked registers 210, each register 210 comprising an input 210a for a feedback signal or an input signal and an output 210b for an output signal. Moreover, the registers 210 further comprise a clock signal input 210c for a clock signal. Similar to the registers 110 of FIGS. 1a and 1b, also the registers 210 are adapted to store at least two states in response to a signal presented to their respective inputs 210a and a corresponding clock signal presented to the clock signal input 210c. The registers 210 are adapted to provide at their outputs 210b a signal indicative of their state.

The block diagram of FIG. 2 shows a first register 210-1 and a second register 210-2, which are coupled to a common clock signal line 220 to provide the registers 210 with a corresponding clock signal in parallel via their clock signal inputs 210c. Moreover, the state machine 200 as shown in FIG. 2 comprises a feedback circuit 230 with a plurality of inputs 230a and a plurality of outputs 230b. The number of inputs 230a corresponds at least to the number N of registers 210 of the state machine 200 so that each of the registers 210 is connected to an individual input of the feedback circuit 230 in the embodiment shown here. Accordingly, also the number of outputs 230b of the feedback circuit 200 corresponds at least to the number of registers 210 so that each of the registers 210 is connected via its input 210a to one of the outputs 230b of the feedback circuit 230. However, in other embodiments according to the present invention the number of inputs or outputs of the feedback circuit 230 may be smaller or larger.

The plurality of registers 210 and the feedback circuit 230 form a closed feedback loop, wherein the feedback circuit 230 generates a plurality of feedback signals which are provided to the inputs 210a of the registers 210. Since the registers 210 are adapted to assume a state corresponding to a signal provided to the input 210a upon reception of a clock signal (e.g. an edge or a transition or level of the clock signal) provided via the clock signal line 220, the feedback circuit 230 influences the change of states via a creation of the feedback signals from clock cycle to clock cycle of the clock signal. Sometimes a register is also referred to as a flip-flop. In other words, a register, such as the registers 210, are adapted to store at least two different states. The state to be stored is provided to the input 210a of the register 210 and will be stored therein upon reception of a clock signal. In contrast, a latch may be transparent or freeze a state depending on a control signal provided to a control signal input.

However, before describing the functionality of the state machine 200 as shown in FIG. 2 in more detail, it should be noted that the outputs 210b of the registers 210 are coupled directly or indirectly to an output 240 of the LFSR 200 so that not only the output signals of the registers 210 are provided to the feedback circuit 230 but also to the output 240.

The feedback circuit 230 is output such that depending on a feedback function and the signals provided to the inputs 230a of the feedback circuit 230 the feedback signals are generated and provided via the outputs 230b to the inputs 210a of the registers 210. The feedback circuit 230 is, in this context, adapted such that a single application of the feedback function leads to new states of the registers 210 representing a state of a linear feedback shift register, for instance, as shown in FIG. 1a or 1b, initialized with the original states of the registers 210 after being clocked multiple times. In other words, the feedback function as implemented in the feedback circuit 230 offers the possibility of generating feedback signals and providing them to the inputs 210a of the registers 210 which correspond to a multiple application of clock cycles of a clock signal to a LFSR initialized with states as present in the registers 210 of the state machine 200 before providing the appropriate clock signal to the clock signal line 220.

A single application of the feedback function as implemented in the feedback circuit 230 results in the generation of feedback signals such that immediately consecutively generated pseudo-random words at the outputs 210b of the registers 210 in response to the clock signal represent the change of states which in the case of a LFSR may use multiple clock cycles. In embodiments according to the present invention, this may lead to the feedback circuit 230 generating at least two feedback signals based on register output signals of at least two different registers 210, as will be explained in the context of FIGS. 4, 5 and 8 in more detail. However, it is important to note that in embodiments according to the present invention, the feedback signals only depend on the feedback function and the plurality of register output signals. Further parameters are typically not required, although the feedback function itself may be programmable or provided to a feedback circuit 230 which will be described in more detail later on.

Hence, embodiments according to the present invention are based on the findings that a plurality of bits of a pseudo-random bit stream may be generated in parallel to form pseudo-random words of a pseudo-random word stream by implementing a state machine 200 with a plurality of parallel connected registers 210 to a feedback circuit 230 generating a plurality of feedback signals and providing same to the inputs 210a of the registers 210. Embodiments according to the present invention in the form of a state machine 200, therefore, enable a faster generation of a pseudo-random word stream since, for each clock cycle not just one feedback signal, as in the case of a LFSR, is generated, but a plurality of feedback signals, each provided to one of the registers 210 without sacrificing the statistical quality of the generated pseudo-random bit stream of a LFSR.

A state machine 200 according to an embodiment of the present invention may offer, therefore, the possibility of generating an almost arbitrary pseudo-random bit stream for at-speed tests, which may be an interesting motivation for implementing such. Moreover, embodiments according to the present invention may be implemented in a field of interest in which a direct implementation of a linear feedback shift register and at full rate of, for instance 8 or 10 Gbps or more is an extremely challenging task. Depending on the actual frequency of the clock signal itself, a generation of the pseudo-random words is limited in terms of speed, mostly by the speed of the registers 210, the signal propagation time of the interconnecting signal lines and propagation delay of the feedback circuit 230. For instance, the propagation delay of the feedback circuit 200 should be lower than the period of a single period of the clock signal. Hence, based on a clock cycle frequency of 1 GHz, the propagation delay of the feedback circuit 230 should not be longer than 1 ns. To put it in more general terms, the propagation delay of a feedback circuit 230 should be smaller than 1/f wherein f is the frequency of the clock signal as provided to the registers 210.

The state machine 200 as shown in FIG. 2 may optionally comprise a circuit 250 coupled in between the outputs 210b of the registers 210 and the output 240 of the state machine 200. The circuit 250 may for instance be a circuit adapted to generate from the parallel provided output signals of the registers 210 a sequentially encoded pseudo-random word and provide same to the output 240 of the state machine 200. Moreover, the circuit 250 may also comprise further components or circuits on the basis of which the pseudo-random bits as provided by the registers 210 in parallel to the circuit 250 are transferred into an appropriate output signal of the state machine 200. For instance, in the case of a noise generator, the circuit 250 may comprise a digital/analogue converter, a look-up table or another component to transfer the parallel digital information encoded in the signals of the registers 210 into a desired output signal provided the output 240 of the state machine 200.

Moreover, as indicated by a dashed arrow 260 the feedback circuit 230 may be programmable by providing a programming signal to an input 260 of the feedback circuit 230 so that the feedback circuit may depend on one or more parameters as provided to the feedback circuit 230. This, however, is an optional component which is by far not required in the case of an implementation of the feedback circuit 230 according to an embodiment of the present invention. This, however, offers the opportunity to implement a generation of a pseudo-random bit stream polynomial being programmable. As will be outlined in more detail in the context of FIGS. 6 and 7, this may, for instance, be achieved on the basis of a modular-2 scalar product of a set of multi-transmission matrix elements and the values of the register output signals as provided to the inputs 230a of the feedback circuit 230. This will be described in more detail with respect to both, the mathematical background and an implementation in more detail below.

A way to determine the previously mentioned multi-transmission matrix elements which enables a generation of multiple bits in one cycle of the clock signal for programmable polynomials will be described in more detail below. Hence, FIG. 2 shows an apparatus containing a programmable state machine that generates multiple bits of a pseudo-random bit stream with optionally arbitrary polynomials in one clock cycle. Apart from the mentioned multi-transmission matrix elements, also other programming signals may be provided to the input 260 of the feedback circuit 230. In other embodiments according to the present invention, the programming signal may comprise a truth table, a script or a program code in a language for programming a LPGA or the like.

However, before describing a more concrete implementation of a state machine 200 according to an embodiment of the present invention, with respect to FIGS. 3, 4 and 5, a generator for generating a description of a state machine feedback function and the basic principle behind a generator according to an embodiment of the present invention will be described first.

Figure 3:
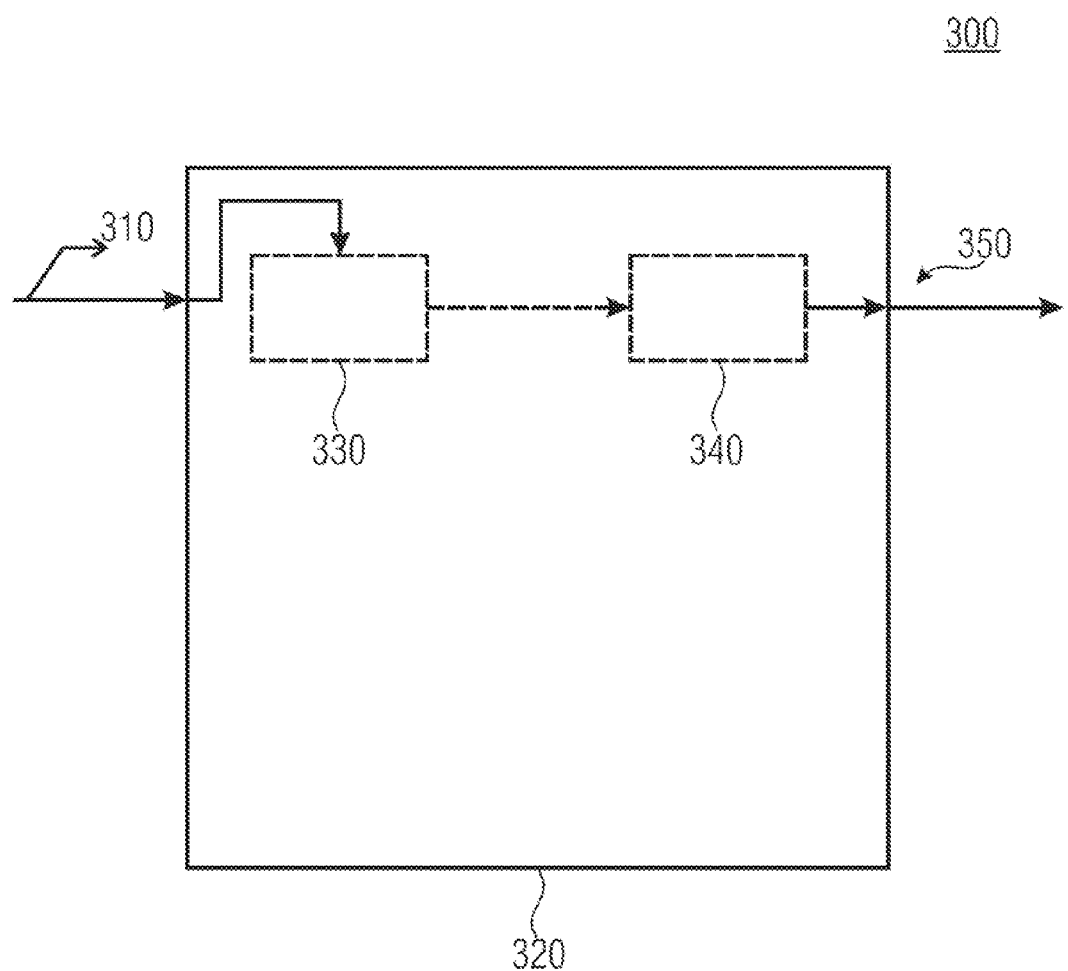
FIG. 3 shows a generator for generating a description of a state machine feedback function according to an embodiment of the present invention.

FIG. 3 shows a schematic block diagram of a generator 300 for generating a description of a state machine feedback function on the basis of a set of generator polynomial coefficients 310. The generator 300 comprises as a central component a calculator 320 to which the generator polynomial coefficients 310 are provided. The calculator 320 is configured to determine a state transmission between immediately subsequent states of the state machine defined by the feedback function corresponding to a sequence of state transitions of a linear feedback shift register. The operation of a linear feedback shift register is, in this context, based on the polynomial corresponding the generator polynomial coefficients 310.

In some embodiments according to the present invention, the calculator 320 is adapted to optionally generate a single transition matrix 330 as will be described in more detail in the context of FIGS. 4 and 5, and afterwards, based on the single transition matrix 330, a multi-transition matrix 340. The multi-transition matrix elements of the matrix 340 may then be provided as the description of the feedback function at an output 350 of the generator 300, for instance, to the optional input 260 of the feedback circuit 230 shown in FIG. 2.

However, it should be noted that a generator 300 according to an embodiment of the present invention is by far not required to being based on the calculation of the single transition matrix 330 and the multi-transition matrix 340. Embodiments according to the present invention utilizing a different technique will be laid out in more detail below. However, in the following first of all the generator 300 being based on the calculation of the two previously mentioned matrices 330, 340 will be described.

A first observation on which an implementation of the generator 300 using the two matrices 330, 340 is based on, is that a linear state machine such as the state machine 200 according to an embodiment of the present invention, but also the linear feedback shift register as, for instance, shown in FIGS. 1a and 1b, can be described by a state transition matrix T. In the case of a digital or binary implementation of a generator 300 according to an embodiment of the present invention, for being used in context with a digital or binary implementation of a state machine 200 according to an embodiment of the present invention, it should be noted that the corresponding mathematical relations are defined over the corresponding mathematical field, which is in this case the Galois field GF(2). Accordingly, adding or summing up elements in the field corresponds to a XOR-combination of the corresponding elements. The other combination in the field, the multiplication, corresponds to an AND-combination of the respective elements to be multiplied with each other. Calculations in this field are sometimes also referred to as modular-2 calculations.

Hence, the state machine 200 according to an embodiment of the present invention as well as a linear feedback shift register as, for instance, shown in FIGS. 1a and 1b, may be, described by a state-transition matrix T with XOR-combination as an addition or formation and a AND-combination as a multiplication.

Figure 4:
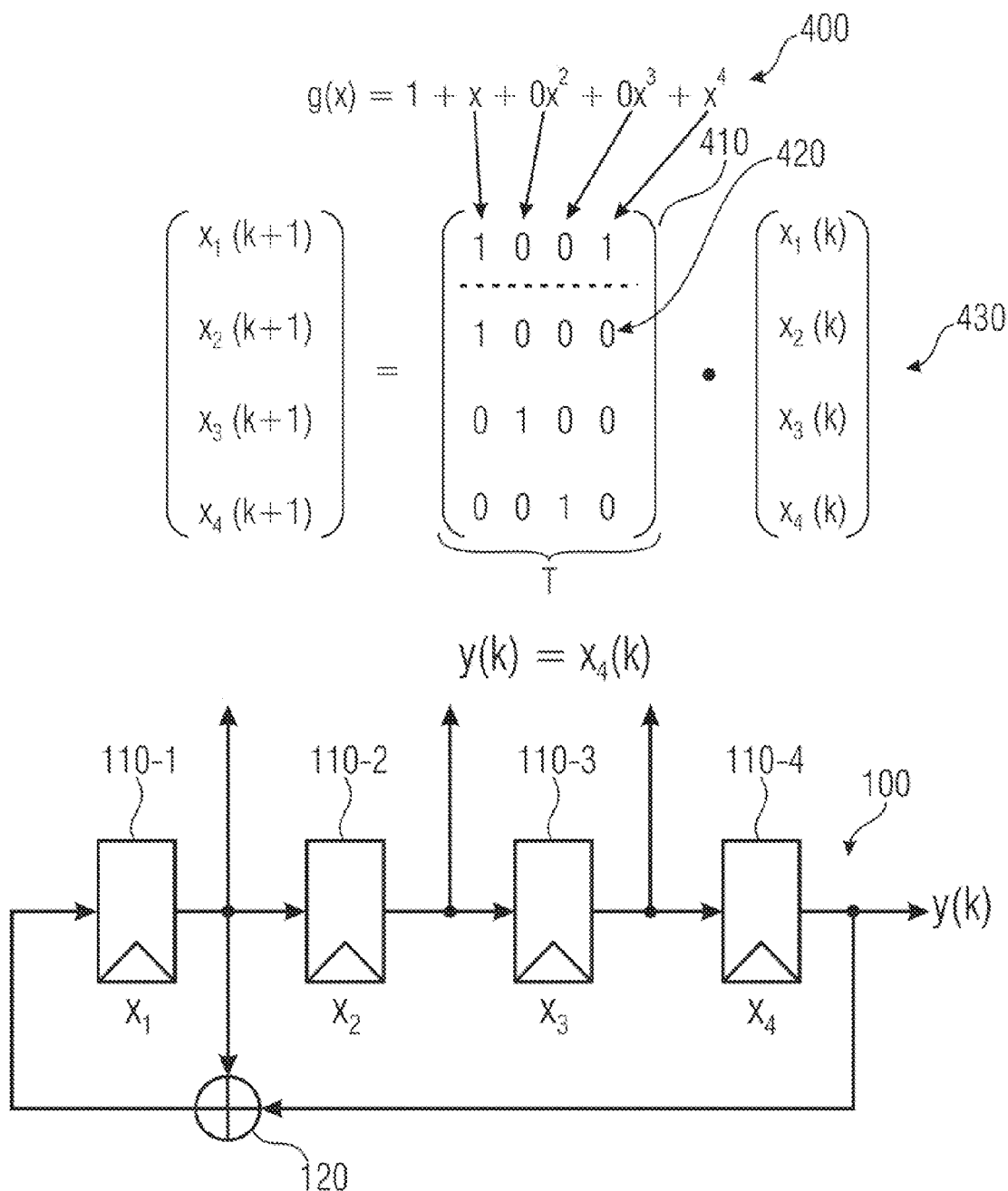

To illustration this, FIG. 4 shows at the bottom the linear feedback shift register 100 of FIGS. 1a and 1b. As described in the context of equation (1), the LFSR 100 shown in the lower part of FIG. 4 is based on the generator polynomial 400, which is extended by a summands corresponding to the vanishing contributions compared to equation (1). Defining the states of the four registers 110-1, ..., 110-4 as $x_1(k)$, ..., $x_4(k)$, wherein k is an index indicating a number of state transitions, which may in some embodiments according to the present invention be equal to or depend on the number of clock cycles of the clock signal.

With a vector x(k) given by $$x(k) = \begin{pmatrix} x_1(k) \\ \vdots \\ x_N(k) \end{pmatrix} \quad (2)$$

for a linear feedback shift register 100 with N registers 110, the transition to the next state is given by $$x(k+1) = T \cdot x(k) \quad (3)$$

with a state-transition matrix T. Since the state-transition matrix T represents a single transition of the states $x_1, \ldots, x_N$, it is also referred to as a single transition matrix or single transition matrix description.

In the case of a linear feedback shift register 100 shown in FIGS. 1a, 1b and the bottom of FIG. 4 with N=4, the single transition matrix T is given by the matrix 410 as shown in FIG. 4. The first row of the matrix 410 is given by a set of generator polynomial coefficients of the polynomial 400 apart from the constant summoned 1 indicative of the XOR-gate 120 of the linear feedback shift register 100. A sub-matrix 420 extending from the second row to the last row describes a shift of the states of the registers 110 in response to a clock signal which is caused by the daisy-chain configuration of the registers 110. For the sake of completeness, it should be noted that the matrix 410 as all single transition matrices are quadratic matrices since the corresponding matrices describe a transition of states of registers 110 so that the number of initial states and the number of states after the transition are equal and given by the number N of registers 110 in the LFSR 100 or the number of registers 210 of the state machine 200 according to an embodiment of the present invention, as will be outlined below.

With the matrix 410 as the single transition matrix T, equation (3) becomes the matrix equation 430 as shown in FIG. 4. Moreover, for the sake of completeness, it should be noted that the output of the linear feedback shift register 100 shown in FIG. 4 corresponds to the state $x_4$ (k) of the register 110-4. Naturally, in the case of a linear feedback shift register 100 with N registers 110 the output of a corresponding LFSR 100 is the state $x_N$ of register 110-N.

Providing a linear feedback shift register as the LFSR 100 shown in the bottom of FIG. 4 with more than one clock cycle so that more than one state transition takes place, the state vector x(k) changes according to consecutive application of the matrix equation (3). Hence, after R clock cycles, wherein R is an integer larger than 1, the states of the registers 110 as given by the state vector x(k+R) are given by $$x(k+R) = T^R \cdot x(k), \quad (4)$$

wherein equation (4) also holds true for R=1. Hence, for the application of equation (4) R may be any non-negative integer. Just as a side note, in equation (4) R may even be a negative integer to reestablish a previous state, if matrix T is invertible. This illustrates the deterministic nature of a pseudo-random number generator such as the state machine 200 according to an embodiment of the present invention.

However, based on equation (4) the concept of a possible implementation of a generator 300 according to an embodiment of the present invention can be explained. Based on equation (4) it is possible to synthesize a state machine 200 according to an embodiment of the present invention that outputs R bits per clock cycle. The linear finite state machine 200 with a state transition matrix or multi-transition matrix A based on the equation $$A = T^R \quad (5)$$

comprises R subsequent pseudo-random bits of a pseudo-random bit stream in its first R state variables corresponding to R registers 110, wherein, for the moment, R is assumed to be equal to or smaller than N, the number of registers of the underlying LFSR. The state machine 200 according to an embodiment of the present invention may then proceed to the next R bits of a pseudo-random bit stream or a next word of the pseudo-random word stream in a single clock cycle based on the equation $$z(k+1) = A \cdot z(k), \quad (6)$$

wherein z(k) is a state vector comprising the states $z_1(k), \ldots, z_N(k)$ of the registers of 210 of the state machine 200 according to an embodiment of the present invention in accordance with $$z(k) = \begin{pmatrix} z_1(k) \\ \vdots \\ z_N(k) \end{pmatrix}. \quad (7)$$

In other words, the preceding description of the functionality of a generator 300 according to an embodiment of the present invention illustrates a method according to an embodiment of the present invention for generating a state machine description in the form of the multi-transition matrix elements for a state machine 200 according to an embodiment of the present invention that generates multiple bits of a pseudo-random bit stream per clock cycle, given the corresponding polynomial.

In the case of a state machine 200 according to an embodiment of the present invention which is intended to provide more bits in one clock cycle than the number of registers N of the underlying linear feedback shift register, the number of registers 210 of the state machine 200 is extended so that a sufficient number of registers 210 exists to store the corresponding states. In other words, in the case that the number of bits R to be generated by the state machine 200 according to the present invention, corresponding to R clock cycles of the underlying linear feedback shift register, is larger than the number N of registers 110 of the corresponding LFSR 100, the original shift register is extended so that R registers of flip-flops are capable of comprising R subsequent bits of the pseudo-random bit stream. Naturally, the extension is not limited to the number of bits to be provided (R). Hence, the state machine 200 according to an embodiment of the present invention may comprise G registers 210, wherein G is equal to or larger than a maximum of the number of registers N of the underlying linear feedback shift register and the number R of bits to be generated in one clock cycle. Accordingly, also the size of the single transition matrix T and that of the multi-transition matrix A according to equation (5) may comprise G elements each direction. Both matrices are, therefore, quadratic matrices comprising G×G elements.

Figure 5:
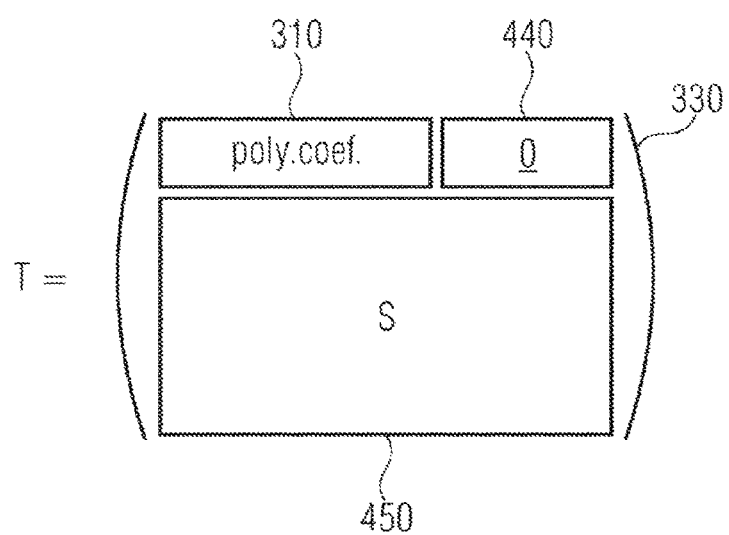
FIG. 5 illustrates a matrix description for a state machine according to an embodiment of the present invention.

To illustrate this further, FIG. 5 shows a schematic representation of the single transition matrix T for the case of R being larger than the number of registers N of the underlying LFSR 100. The single transition matrix T 330 comprises in a first row the elements 310 corresponding to the generator polynomial 400. Based on the set of generator polynomial coefficients $\{q_N, q_{N-1}, \ldots, q_1\}$, corresponding to the polynomial $$g(x) = \sum_{i=1}^{N} q_j x^j + 1. \quad (8)$$

the polynomial coefficients $q_n$ are entered as matrix elements $T_{1n}$ for j=1, ..., N. The rest of row 1, if present at all, will be filled with a column vector 440 (0) comprising zeros. Hence, the matrix element $T_{1j}$ are set to 0 for j=N+1, ..., G.

The rest of the single transition matrix T 330 is filled with a shift matrix S 450 being a sub-matrix of the single transition matrix T. The shift, matrix S 450 is a (G−1)×G matrix comprising the matrix elements $$S_{ij} = \delta_{ij} \quad (9)$$

for i=1, ..., G and j=1, ..., G−1, wherein $\delta_{ij}$ is the Kronecker-symbol. Since the shift matrix S 450 is a sub-matrix of the single transition matrix T 330 starting with the second row, the single transition matrix T comprises a diagonally extending line of ones, $T_{ij}=1$ for i=j+1. Apart from this line of ones and the generator polynomial coefficients 400, the rest of the single transition matrix T 330 only comprises zeros.

In other words, the only non-vanishing elements of the single transition matrix T 330 may be the elements of the aforementioned diagonally extending lines of ones of the shift matrix S 450 and optionally those non-vanishing coefficients of the generator polynomial coefficient 400. The term "non-vanishing" means in this context being not equal to zero, while the term "vanishing" may synonymously be used for being equal to zero, optionally within a reasonable limit defined by a precision of the implementation.

In the case of digital or binary implementations as described in the context of FIGS. 2 and 3 so far, all matrix elements and polynomial coefficients are either 0 or 1. In this case a vanishing element or coefficient is equal to 0 and a non-vanishing element or coefficient is equal to 1.

It should be noted that the equations and formulas given in the present description serve to illustrate and to describe the operational principles of embodiments according to the present invention. When implementing a specific embodiment, indices of the different registers may naturally be altered. This may lead to a "rearrangement" of matrices and other equations. In other words, expressions and equations may differ and comprise permutations with respect to indices and other deviations from the formulas given here.

The calculator 320 of the generator 300 according to an embodiment of the present invention obtains, as an intermediary result, the single transition matrix T 330 based on the generator polynomial coefficients 310 provided to the generator 300. Then the calculator 320 generates the multi-transition matrix A based on equation (5) as laid out in FIG. 5.

Based on the multi-transition matrix description as a description of the feedback function of the feedback circuit 230 of the state machine 200, the feedback circuit 230 is then adapted such that the feedback function represents a plurality of consecutive LFSR-cycles based on the states of the registers 210 to yield the plurality of feedback signals indicative of the next states of the registers 210 of the state machine 200 corresponding to the states of the underlying LFSR after a corresponding number of clock cycles.

However, in many of the embodiments according to the present invention, the generator of the calculator 320 is adapted such that the set of generator polynomial coefficients 310 comprises at least two non-vanishing generator polynomial coefficients. Examples of this have already been shown in equation (1) and the corresponding FIG. 4. Starting from a primitive polynomial for a linear feedback shift register 100, the generator polynomial coefficients 310 in many cases comprise two or more non-vanishing coefficients. Therefore, after an application of equation (5) the multi-transition matrix A 340 (cf. FIG. 3) typically comprises for R being larger than 1 for more than one row of the multi-transition matrix A 340 rows with two non-vanishing elements.

Figure 6:
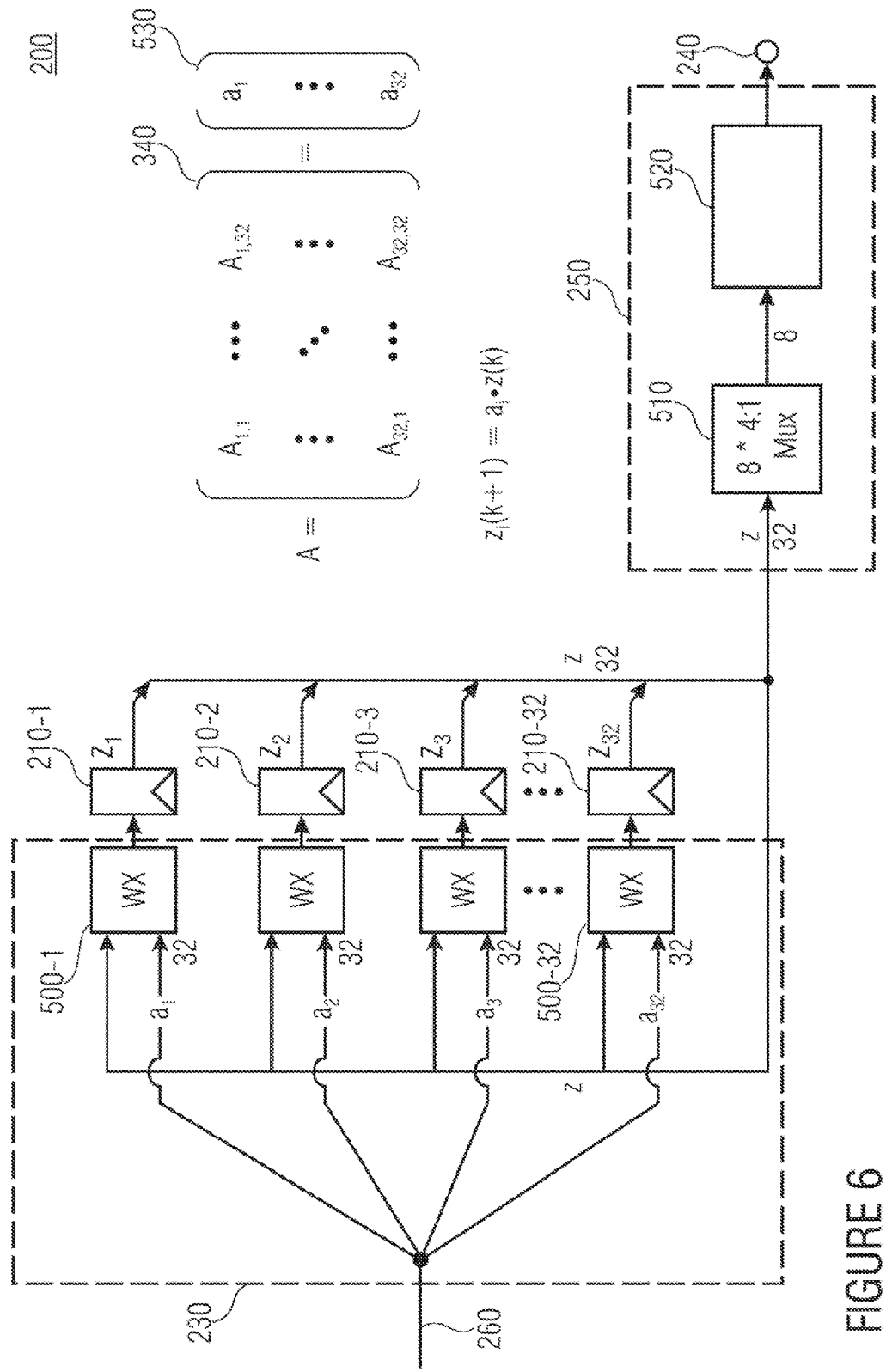
FIG. 6 illustrates an implementation of a state machine according to an embodiment of the present invention.

FIG. 6 shows a further state machine 200 according to an embodiment of the present invention in the form of a programmable state machine allowing a generation of a pseudo-random bit stream based on a programmable polynomial. The state machine 200 of FIG. 6 comprises 32 registers 210-1, ..., 210-32 which are coupled to the feedback circuit 230 with both, there inputs and outputs. The outputs of the registers 210 are coupled to a 32-bit wide bus, which is coupled to an input of the feedback circuit 230.

The feedback circuit 230 comprises a plurality of WX-gates 500-1, ..., 500-32 for each of the registers 210-1, ..., 210-32. Each of the WX-gates 500 comprises two 32-bit wide inputs of which one is coupled to all outputs of the registers 210-1, ..., 210-32 and of which the other is coupled to the input 260 of the feedback circuit 230 to which the feedback function description in the form of the multi-transition matrix A 340 is provided to.

The WX gates 500 are adapted to calculate a modular-2 scalar product of the two 32-element wide vectors provided to their respective inputs and to generate one feedback signal and an output of the WX-gates 500, which is coupled to the input of one of the registers 210. However, before describing a possible implementation of a WX-gate 500, which is also referred to as a weighted XOR sum or weighted XOR adder, as well as the multi-transition matrix elements provided to the WX-gate 500, the outputs of the registers 210 are coupled to an output 240 of the state machine via a circuit 250. The circuit 250 comprises 8×4:1-multiplexer unit 510, which is coupled to the 32 outputs of the registers 210. Eight signal lines connect the multiplexer unit 510 and a parallel/serial transformer 520, which is in turn coupled to the output 240.

From the 32 latched output signals provided by the registers 210 the multiplexer unit 510 generates four 8-bit wide output signals and provides each of these 8-bit wide output signals to the parallel/serial transformer 520. The parallel/serial transformer 520 comprises 8 input signal lines and generates at its output a serial signal comprising the 8 bits received as a serial stream. In other words, the 8×4:1-multiplexer unit 510 and the parallel/serial transformer 520 forming the circuit 250 transform the 32 bits provided in parallel into a serial (1 bit wide) bit stream. By reducing the width of the words successively from 32 bits to 8 bits into 1 bit, the frequency of the provision of bits is increased accordingly so that at the output of the state machine the bits of the PRBS are provided at a rate being 32-times higher than the frequency of the clock signal of the registers 210.

In other words, the 8×4:1-multiplexer unit 510 will typically be provide with a clock signal having a frequency of four times that of the clock signal provided to the registers 210 to switch each of the eight output lines of the multiplexer unit to one of the four connected input lines coupled to the registers 210. The multiplexer unit 510, therefore, allows in the embodiment shown in FIG. 6 the provision of four 8-bit wide pseudo-random words to the parallel/serial transformer 520 based on the 32 states stored in the registers 210. In turn, the parallel/serial transformer 520 will provide at its output the bits with a frequency being 8-times higher than the frequency of the 8×4:1 multiplexer unit 510. As a consequence, the circuit 250 comprising the 8×4:1 multiplexer unit 510 and the parallel/serial transformer 520 allows a generation of an output signal to the output 240 with a frequency 32-times higher than the clock signal provided to the registers 210 in the embodiment shown here.

It should be noted that the circuit 250 as well as its components shown in FIG. 6 are optional components, which may not be implemented at all or modified. Hence, in other state machines 200 according to embodiments of the present invention, circuits 250 allowing a generation of a different number of bits per clock cycle of the clock signal provided to the registers 210 may be implemented. In other words, the frequency of bits provided by the state machine may be any integer-multiple of the frequency of the clock signal provided to the registers 210.

As a further optional component the circuit 250 may also comprise a FIFO-circuit (FIFO=first in-first out) which may be, for instance, used to buffer the generated word stream. This may be for instance interesting in the case, where the state machine 200 cannot be operated in a continuous mode or where the state machine 200 may be halted for a reprogramming of the feedback function, but the word stream may have to be uninterrupted. In the case of implementing a FIFO-circuit or a similar circuit, it may be possible to operate the state machine 200 at a frequency for generating the bits of the bit stream is not necessarily in integer multiple of the frequency of the clock signal provided to the clock signal inputs of the registers 210. In the case of an implementation with a FIFO-circuit or a similar circuit, the frequency of the generated bits may be higher than the clock signal frequency by a factor being larger than 1. Naturally the factor may be also in this case an integer.

Switching back to the feedback circuit 230 and the WX-gates 500, of which an implementation will be described in more detail in the context of FIG. 7, it should be noted that a feedback function description is provided to the input 260 in the form of a multi-transition matrix A 340 as illustrated in FIG. 6. The multi-transition matrix A 340 may be considered as a column vector 530 comprising a plurality of row vectors $a_1, \ldots, a_{32}$ as vector elements, which correspond to the matrix elements $A_{ij}$ of one row each. As already described, the WX-gates 500 are adapted to calculate a modulo-2 scalar product of two 32 elements comprising vectors provided to the two inputs of each of the WX-gates 500. Based on the row vectors $a_i$ for $i=1, \ldots, 32$, each of the WX-gates 500 generates a feedback signal provided to one of the registers 210 indicative of the next state to be acquired by corresponding register 210 according to $$z_i(k+1) = a_i \cdot z(k). \tag{10}$$

In other words, the WX-gates 500 each generate one feedback signal based on a 32-element comprising vector $a_i$ and the 32 states $z_1, \ldots, z_{32}$ of the registers 210.

Since each of the row vectors $a_i$ of the column vector 530 comprises the matrix elements of the multi-transition matrix A 340 of the respective row, the element with the index j of the row vector $a_i$ is given by $$(a_i)_j = A_{ij} \tag{11}$$

As a consequence, the scalar product of vector $a_j$ and the vector $z(k)$ yields the feedback signal or the subsequent state $z_i(k+1)$, which is given by $$z_i(k+1) = \sum_{j=1}^{32} (a_i)_j \cdot z_j(k) = \sum_{j=1}^{32} A_{ij} \cdot z_j(k). \tag{12}$$

In this context, it should be remembered that in the case of a digital or binary implementation as described before, the mathematical calculations of the preceding equations are to be carried out in the mathematical field GF(2) so that a summation is given by a XOR-combination of corresponding elements and a multiplication is equivalent to an AND-combination.

Figure 7:
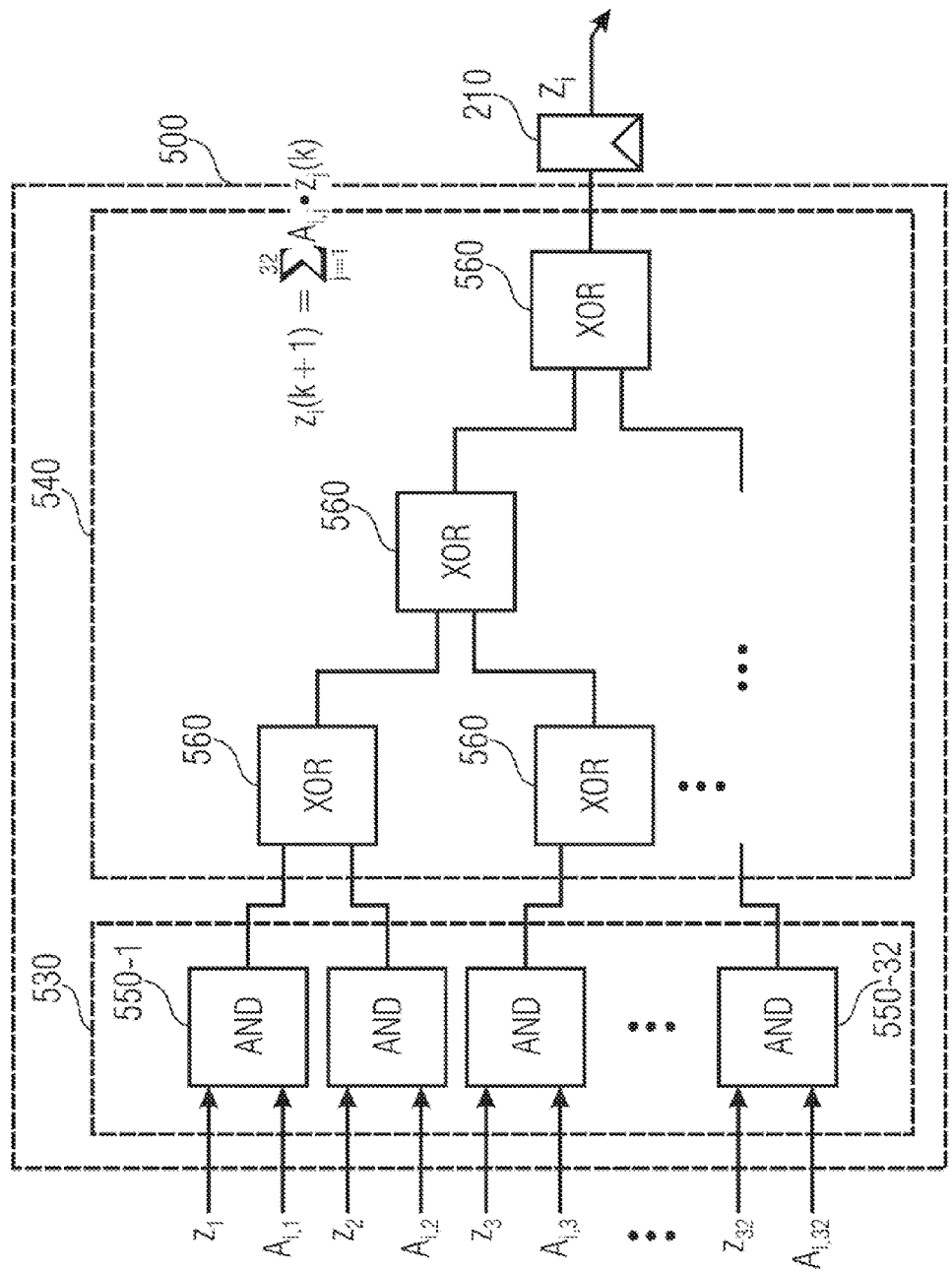
FIG. 7 illustrates a possible implementation of a feedback circuit of a state machine according to an embodiment of the present invention.

FIG. 7 shows a part of a block diagram of the WX-gate 500 as it is implemented in the state machine according to FIG. 6. As illustrated in FIG. 6, the state machine 200 comprises 32 instances of the WX-gate 500. Each of the WX-gates 500 comprises a logic stage 530 and an adder 540. The logic stage 530 comprises 32 AND-gates 550-1, . . . , 550-32 connected in parallel, which each one of the output signals of the registers 210 indicative of the respective states $z_j$ and one element of the multi-transition matrix A is provide to. As outlined in the context of equation (10), the WX-gate 500 for register 210 corresponding to state $z_i$ is provide with the row vector $a_i$ so that to each of the AND gates 550 of the logic stage 530 one of the vector elements or one of the corresponding multi-transition matrix elements according to equation (11) is provided.

In other words, each of the register output signals indicative of the respective state of the register 210 is weighted according to one element of the multi-transition matrix A such that the corresponding signal is either set to a predetermined value (e.g. 0) or a remains unchanged. Each of the AND-gates 550 represents a masking gate by which the corresponding register output signal may be weighted. Accordingly, also other masking gates such as OR-gate, NOR-gate or a NAND-gate may be used.

Since each of the AND-gates 550 comprises two inputs and one output, the number of signals output by the logic stage 530 is reduced by a factor of 2. Starting from the 64 binary signals the first 32 AND-gates 550 of the logic stage 530 reduce the number of signals provided by the logic state 530 to 32.

These 32 logic state output signals are then provided to the adder 540, which comprises a cascade of 31 XOR-gates 560 with two inputs and one output each. The 31 XOR-gates 560 are cascaded to reduce the number of signals in each layer of the cascade approximately by a factor of 2. Hence, the 32 output signals of the logic stage 530 are provided to the first 16 XOR-gates 560 producing 16 intermediate signals of a first layer. These 16 signals are then provided to another 8 XOR-gates 560 which reduce the overall number once again by a factor of 2. The following layers then reduce the number of signals further, until a final XOR-gate 560 is applied to the final two intermediate signals of the previous layer. The output of the last XOR gate 560 is the feedback signal output by the adder 540 and the WX-gate 500. It is provided to the input of the corresponding register 210 as shown in FIG. 7.

Naturally, also in terms of the adder 540 a different configuration from the previously described employing, for instance, XNOR-gates may be used. Moreover, also a different arrangement, eventually requiring more than the 31 XOR-gates or XNOR-gates may be implemented.

Moreover, in other embodiments according to the present invention, a different number of registers 210 than 32 registers and related circuitry may be implemented. In the case of a cascaded adder like the adder 540, it may be possible to implement a similar adder with L layers for a state machine 200 comprising more than $2^{L-1}$ but not more than $2^L$ registers. Since every XOR-gate or XNOR-gate comprises two inputs and one output and reduces therefore the number of signals by one, a similar implementation of a WX-gate 500 may be realized by using the same number of masking gates as the number of registers and one XOR-gate or one XNOR-gate less than the number of registers.

When, for instance, the possibility of different generator polynomials or, in more general terms, the number of different feedback functions is limited such that some elements of the vectors $a_j$ or some matrix elements $A_{ij}$ are constant (e.g. equal to 0) for the different feedback functions, the corresponding AND-gates 550 along with the corresponding XOR-gates 560 may eventually be dropped. Thereby, a simplification of the circuitry may be achieved.

For the sake of completeness, it should be noted that the state machine as illustrated in FIGS. 6 and 7, according to the embodiment of the present invention, may furthermore comprise one or more memory elements such as flip-flops, registers, SRAM-cells or registers to store the elements of the multi-transition matrix A 340. In other words, the state machine 200 as shown in FIGS. 6 and 7 may, for instance, comprise a register to store 32·32=1024 (binary) matrix elements of the matrix A 340 as registered values (in the embodiment described above).

To illustrate that the state machine 200 according to an embodiment of the present invention along with the generator 300 according to an embodiment of the present invention operating on the previously presented matrix-related description, do in fact yield the same result, FIG. 8 shows a direct comparison of an output of a linear feedback shift register 100 as shown in FIG. 1a and that of a corresponding state machine 200 as described in the context of FIGS. 6 and 7.

Figures 8A, 8B, 8C, 8D:
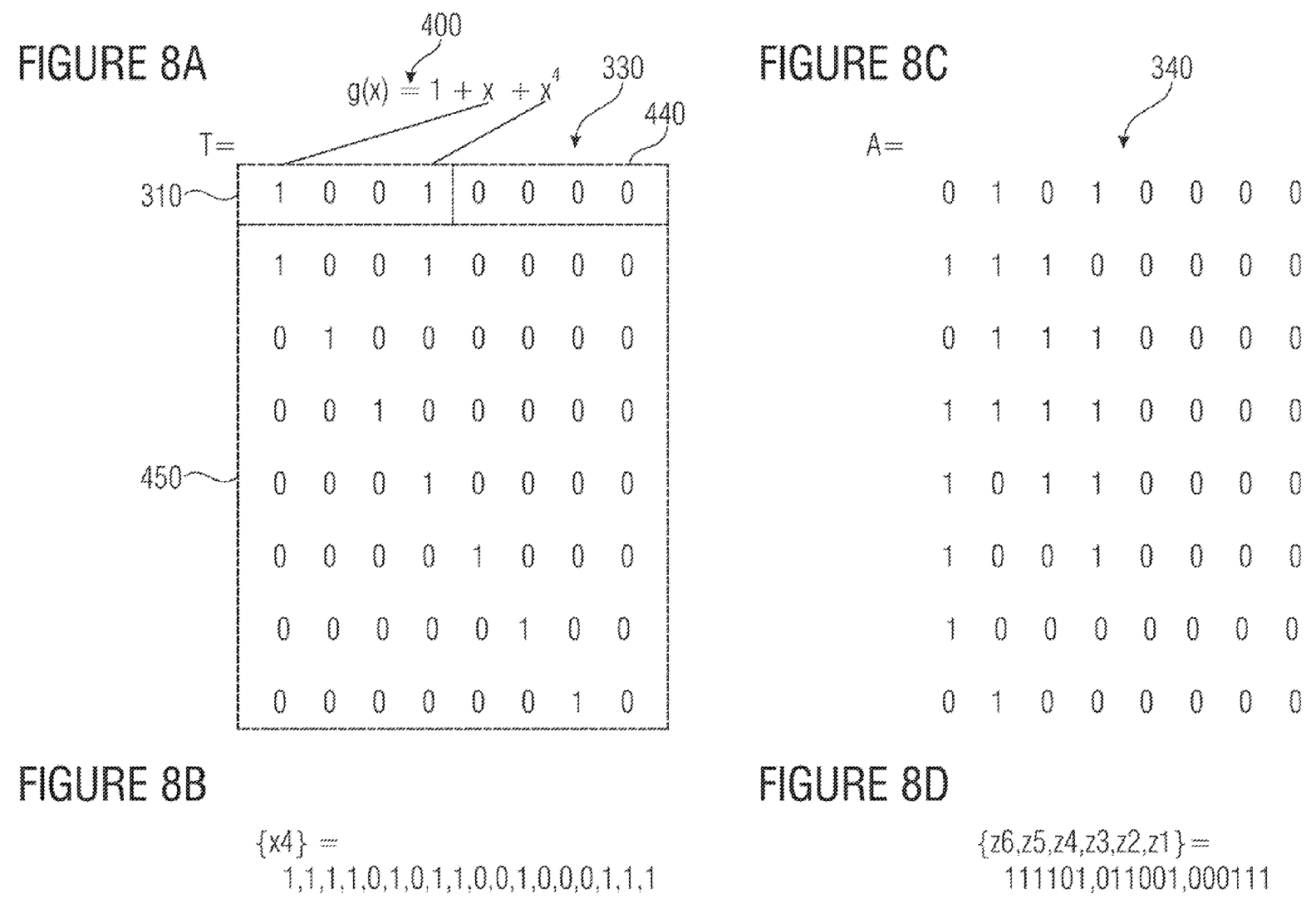

FIG. 8a illustrates the previously described single transition matrix T 330 for a linear feedback shift register 100 with N=4 registers 110. As described in the context of FIGS. 4 and 5, the single transition matrix T comprises in the first row, the generator polynomial coefficients 310 of the corresponding polynomial 400 g(x) according to equation (1).

However, different from the matrix 410 of FIG. 4, the single transition matrix 330 as shown in FIG. 8a is based on an 8×8 matrix for G=8 entries. As a consequence, the signal transition matrix T 330 comprises, apart from the generator polynomial coefficients 310, also the column vector 440 comprising zeros and the shift matrix S 450 as outlined in context of FIG. 5.

FIG. 8b shows a sequence of 18 bits output by the corresponding LFSR 100 as shown in FIG. 1a at the output of register 110-4 which is indicative of the state $x_4$ of this register.

FIG. 8c shows the resulting multi-transition matrix A 340 obtained by a generator 300 according to an embodiment of the present invention based on the generator polynomial coefficients 310 and the resulting intermediate single transition matrix T 330 as shown in FIG. 8a for R=6 bits to be provided in the framework of a pseudo-random word of the pseudo-random word stream generated by a state machine 200 according to an embodiment of the present invention. In other words, FIG. 8c shows the multi-transition matrix $A=T^6$ based on the single transition matrix T shown in FIG. 8a.

Starting from the same initial states of the registers 210 compared to the states of the corresponding registers 110 of the linear feedback shift register 100, the state machine 200 as shown in FIGS. 6 and 7 provided with the multi-transition matrix A as shown in FIG. 8c provides the word stream shown in FIG. 8d comprising the same 18 pseudo-random bits as shown in FIG. 8b. In other words, both sequences are identical, which proves the concept.

Apart from the previously described matrix-implementation of embodiments according to the present invention in the form of a state machine 200 and in the form of a generator 300 also further straight-forward implementations may be realized, which are, however, at least theoretically based on the same matrix description. Returning to FIG. 2, the feedback function of the feedback circuit 230 may also be programmable by providing the feedback circuit 230 via the input 260 with a truth table to define each of the feedback signals on the basis of the states of the registers 210. Such a truth table-like implementation may, for instance be realized by employing a memory-like structure in which all possible different states of the state machine 200 may be considered as an address input signal, wherein the corresponding values stored in the memory corresponds the generated feedback signal. Such an implementation may be realized on the basis of RAM techniques (RAM=Random Access Memory), NVM techniques (NVM=Non-Volatile Memory) or ROM techniques (ROM=Read-Only Memory), depending on whether the feedback function is supposed to be programmable (RAM, NVM implementation) and whether the truth table is supposed to be stored in a non-volatile way (NVM, ROM implementation). Naturally, in the case of a non-programmable implementation based on a ROM technology, an optimization may, for instance, be employed by only implementing memory cells for either feedback signals which are equal to one or equal to zero, depending on further details of the embodiment.

An alternative truth table-based implementation may be that of a FPGA (FPGA=Field Programmable Gate Array), in which a logical expression describing the behavior of the corresponding state machine 200 according to an embodiment of the present invention may be stored utilizing look-up-tables and other elements of typical FPGA implementation.

Naturally, in all of the previously described straight-forward implementations, an optimization based on a logical description of the corresponding feedback function using the rules of Boolean algebra may be utilized. By starting from a truth table and by isolating all combinations of states which lead to a feedback signal having the value of one and by concatenating the corresponding logic expressions (e.g. based on a plurality of AND-combinations) may be a starting point for such an optimization. The optimization may then use, for instance, the different rules of Boolean algebra to transform the resulting expression into a more concise expression which may then, for instance, be implemented using the previously described FPGA structure.

Furthermore, it should be noted that the different embodiments according to the present invention may for instance be combined in the framework of a system. In other words, a generator 300 according to an embodiment of the present invention as shown in FIG. 3 may be coupled via its output 350 to the input 260 of the feedback circuit 230 of a state machine 200 according to an embodiment of the present invention. As a consequence, this may lead to a very concise and flexible system being capable of providing a pseudo-random word stream or pseudo-random bit stream based on a generation polynomial coefficient and the number of bits per word.

Moreover, it should be noted that the systems, state machines and generators according to embodiments of the present invention described above also correspond to a description of respective methods according to the present invention. In other words, to some extent the figures described before also reflect flow charts of corresponding methods according to embodiments of the present invention.

Depending on certain implementation requirements of embodiments according to the present invention, embodiments of inventive methods can be implemented in hardware or in software. The implementation can be performed using a digital storage medium, in particular, a disc, a CD or a DVD having electronically readable control signals stored thereon, which cooperate with a programmable computer or processor such that an embodiment of the inventive method is performed. Generally, an embodiment of the present invention is, therefore, a computer program product where the program code is stored on a machine-readable carrier, the program code being operative for performing an embodiment of the inventive methods, when the computer program runs on the computer or processor. In other words, embodiments of the inventive method are, therefore, a computer program having a program code for performing at least one of the embodiments of the inventive methods, when the computer program runs on the computer or processor. A processor can be formed by computer, a chip card, a smart card, an application-specific integrated circuit (ASIC), a system-on-chip (SOC) or another integrated circuit (IC).

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A state machine for generating a pseudo-random word stream, each word of the word stream comprising a plurality of subsequent bits of a pseudorandom bit sequence, the state machine comprising:
   a plurality of clocked registers, the registers comprising corresponding inputs and corresponding outputs; and
   a feedback circuit coupled to the inputs and to the outputs of the registers and adapted to provide a plurality of feedback signals to the inputs of the registers based on a feedback function and the plurality of register output signals of the registers, the register output signals being indicative of states of the registers,
   wherein the state machine is configured such that a first word defined by the plurality of register output signals comprises a first set of subsequent bits of the pseudorandom bit stream and such that a subsequent second word defined by the plurality of register output signals comprises a second set of subsequent bits of the pseudorandom bit stream;
   wherein the feedback circuit comprises a logic stage and an adder;
   wherein the logic stage is configured to provide a plurality of logic stage output signals on the basis of the output signals of the registers by selectively weighing the output signals of the registers depending on a set of multi-transmission matrix elements;
   wherein the logic stage comprises a masking gate configured to provide a logic stage output signal depending on an output signal of one of the registers and one of the multi-transmission matrix elements;
   wherein the adder is configured to provide at least one feedback signal using a modulo-2 summation of the logic stage output signals; and
   wherein the adder comprises a plurality of XOR-gates or XNOR-gates for the modulo-2 summation.

2. The state machine according to claim 1, wherein the feedback circuit is adapted such that the plurality of feedback signals provided to the inputs of the registers are based on a single application of the feedback function leading to new states of the registers, the new states representing a state of a linear feedback shift register initialized with the original states of the registers after being clocked multiple times.

3. The state machine according to claim 1, wherein the feedback circuit is configured to provide at least two feedback signals based on register output signals of at least two different resisters.

4. The state machine according to claim 1, wherein the feedback circuit is configured such that the feedback signals depend only on the feedback function and the plurality of register output signals.

5. The state machine according to claim 1, wherein the feedback circuit is configured such that the second word immediately follows the first word in response to a clock signal.

6. The state machine according to claim 1, wherein the state machine is adapted to provide the pseudo-random bit sequence with a frequency being higher than a frequency of the clock signal provided to the registers by a factor larger than 1.

7. The state machine according to claim 1, wherein the feedback circuit is configured so that the feedback function is programmable.

8. The state machine according to claim 1, wherein the feedback circuit is configured such that at least one feedback signal of the plurality of feedback signals is provided based on a modular-2 scalar product of a set of multi-transmission matrix elements and values of the register output signals.

9. The state machine according to claim 1, wherein the adder comprises a cascade of layers of XOR-gates or XNOR-gates to reduce a number of signals in each layer in the cascade of layers by approximately a factor of 2.

10. The state machine according to claim 9, wherein the cascade of layers of the adder comprises L layers, wherein the plurality of clocked registers comprises more than $2^{L-1}$ and less than or equal to $2^L$ registers, and wherein L is an integer.

11. A generator for generating a description of a state machine feedback function on the basis of a set of generator polynomial coefficients defining configuration of a linear feedback shift register, the generator comprising:
   a calculator configured to calculate the description of the state machine feedback function for a state machine on the basis of the set of generator polynomial coefficients,
   wherein the calculator is configured to determine the feedback function such that a state transition between immediately subsequent states of the state machine defined by the feedback function corresponds to a sequence of state transitions of a linear feedback shift register, the linear feedback shift register being configured in accordance with the generator polynomial coefficients;
   wherein the calculator is configured to acquire, as an intermediate result, a single transition matrix description of a state machine feedback function on the basis of the generator polynomial coefficients of the linear feedback shift register, the single transition matrix description describing a relationship between an initial state of a state machine and a consecutive state of the state machine according to the generator polynomial coefficients for a single linear feedback shift register state transition;
   wherein the calculator is configured to compute a power of the single transition matrix description to acquire, as the state machine feedback function, a multi-transition matrix description describing, in a combined form, a plurality of linear feedback shift register state transitions; and wherein the calculator is adapted to calculate the multi-transition matrix description A comprising the multi-transition matrix elements $A_{ij}$ based on the equation $$A = T^R \bmod 2$$

wherein T is the single transition matrix description comprising the single transition matrix elements $T_{ij}$ wherein i is a row index in the range between 1 and G, wherein j is a column index in the range between 1 and G, wherein N is a number of registers of the linear feedback shift register, wherein R is an integer larger than N, wherein G is an integer larger than or equal to a maximum of N and R, wherein $T_{1j}$ for j in the range between 1 and N is equal to the set of generator polynomial coefficients, wherein $T_{ij}$ for i=j+1 and j in the range between 1 and (G−1) is equal to 1, and wherein $T_{ij}$ is equal to 0.

12. The generator according to claim 11, wherein the calculator is configured such that a single state transition of the state machine based on the determined feedback function corresponds to the sequence of state transitions of the linear feedback shift register.

13. The generator according to claim 11, wherein the calculator is configured such that the state transitions of the state machine starting from initial states of the registers correspond to states of the linear feedback shift register starting from the same states after a sequence of state transitions of the linear feedback shift register.

14. The generator according to claim 11, wherein the generator is adapted such that the description of the state machine feedback function comprises only binary units.

15. The generator according to claim 11, wherein the generator adapted such that the set of generator polynomial coefficients $(q_N, q_{N-1}, \ldots, q_1)$ corresponds to A polynomial $$g(x) = 1 + \sum_{n=1}^{N} q_n x^n$$

of the linear feedback shift register comprising N registers wherein $q_n$ is 0 or 1 for n=1, ..., N.

16. The generator according to claim 11, wherein the generator is adapted such that the set of generator polynomial coefficients comprises at least two non-vanishing generator polynomial coefficients.

17. A method for generating a description of a state machine feedback function on the basis of a set of generator polynomial coefficients defining a configuration of a linear feedback shift register, the method comprising:
calculating the description of the state machine feedback function for a state machine on the basis of the set of generator polynomial coefficients such that a state transition between immediately subsequent states of the state machine defined by the feedback function corresponds to a sequence of state transitions of the linear feedback shift register configured in accordance with a generator polynomial coefficients wherein calculating the description comprises generating a set of parameter coefficients $A_{ij}$ such that $$A = T^R \bmod 2$$

wherein $A_{ij}$ are elements of the matrix A, wherein T is a matrix comprising elements $T_{ij}$, wherein i is a row index in the range between 1 and G, wherein j is a column index in the range between 1 and G, wherein G is an integer larger or equal to a maximum of N and R, wherein $A_{1j}$ for j in the range between 1 and N is given by the set of generator polynomial coefficients,
wherein $T_{ij}$ for i=j+1 and j in the range between 1 and (G−1) is equal to 1,
wherein $T_{ij}$ is else equal to 0.

18. A method for generating a pseudo-random word stream using a state machine, each word z(k) of the word stream comprising R bits, based on a set of parameter coefficients $A_{ij}$ according to $$A = T^R \bmod 2$$

wherein $A_{ij}$ are elements of a matrix A, wherein T is a matrix comprising elements Tij 1 wherein i is a row index in the range between 1 and G, wherein j is a column index in the range between 1 and G, wherein G is an integer larger than or equal to a maximum of N and R, wherein $A_{1j}$ for j in the range between 1 and N is given by a set of generator polynomial coefficients comprising N bits indicative of a feedback polynomial, wherein N is an integer larger than 1, wherein R is a positive integer larger than N;

wherein $T_{ij}$ for and i=j+1 in the range between 1 and (G−1) is equal to 1, wherein $T_{ij}$ is else equal to 0, the method comprising:
generating the word z(k) in a plurality of clocked registers by providing feedback signals from a feedback circuit to inputs of the clocked registers such that $$z(k+1) = A \cdot z(k) \bmod 2$$

wherein $z_j(k)$ is a vector element of the word z(k) in the form of a vector, wherein k is a time index.

19. A non-transitory computer readable medium, that store instructions for executing a program, when executed by a processor, that performs the method according to claim 18.

20. A state machine for generating a pseudo-random word stream, each word of the word stream comprising a plurality of subsequent bits of a pseudo-random bit sequence, the state machine comprising:
a plurality of clocked registers, the registers comprising corresponding inputs and corresponding outputs; and
a feedback circuit coupled to the inputs and to the outputs of the registers and adapted to provide a plurality of feedback signals to the inputs of the registers based on a feedback function and the plurality of register output signals of the registers, the register output signals being indicative of states of the registers,
wherein the state machine is configured such that a first word defined by the plurality of register output signals comprises a first set of subsequent bits of the pseudo-random bit stream and such that a subsequent second word defined by the plurality of register output signals comprises a second set of subsequent bits of the pseudo-random bit stream;
wherein the feedback circuit is adapted such that the plurality of feedback signals provided to the inputs of the registers are based on a single application of the feedback function leading to new states of the registers, the new states representing a state of a linear feedback shift register initialized with the original states of the registers after being clocked multiple times; and
wherein the feedback function comprises a set of parameter coefficients $A_{ij}$ such that $$A = T^R \bmod 2$$

wherein $A_{ij}$ are elements of the matrix A, wherein is a matrix comprising elements $T_{ij}$, wherein i is a row index in the range between 1 and G, wherein j is a column index in the range between 1 and G, wherein G is an integer larger than or equal to a maximum of N and R, wherein $A_{1,j}$ for j in the range between 1 and N is given by the set of generator polynomial coefficients, wherein $T_{ij}$ for i=j+1 and j in the range between 1 and (G−1) is equal to 1, wherein $T_{ij}$ is else equal to 0.

21. A system for generating a pseudo-random word stream, each word of the word stream comprising a plurality of subsequent bits of a pseudo-random bit sequence, the system comprising:
a state machine according to any of the claims 1 and 20; and
a generator for generating a description of a state machine feedback function on the basis of a set of generator polynomial coefficients defining a configuration of a linear feedback shift register, the generator comprising:
a calculator configured to calculate the description of the state machine feedback function for a state machine on the basis of the set of generator polynomial coefficients,
wherein die calculator is configured to determine the feedback function such that a state transition between immediately subsequent states of the state machine defined by the feedback function corresponds to a sequence of state transitions of a linear feedback shift register, the linear feedback shift register being configured in accordance with the generator polynomial coefficients;
wherein the calculator is configured to acquire, as an intermediate result, a single transition matrix description of a state machine feedback function on the basis of the generator polynomial coefficients of the linear feedback shift register, the single transition matrix description describing a relationship between an initial state of a state machine and a consecutive state of the state machine according to the generator polynomial coefficients for a single linear feedback shift register state transition;
wherein the calculator is configured to compute a power of the single transition matrix description to acquire, as the state machine feedback function, a multi-transition matrix description describing, in a combined form, a plurality of linear feedback shift register state transitions; and
wherein the calculator is adapted to calculate the multi-transition matrix description A comprising the multi-transition matrix elements $A_{ij}$ based on the equation $$A = T^R \bmod 2$$

wherein T is the single transition matrix description comprising the single transition matrix elements $T_{ij}$, wherein i is a row index in the range between 1 and G, wherein j is a column index in the range between 1 and G, wherein N is a number of registers of the linear feedback shift register, wherein R is an integer larger than N, wherein G is an integer larger than or equal to a maximum of N and R, wherein $T_{1,j}$ for j in the range between 1 and N is equal to the set of generator polynomial coefficients, wherein $T_{ij}$ for i=j+1 and j in the range between 1 and (G−1) is equal to 1, and wherein $T_{ij}$ is equal to 0,
wherein the feedback circuit of the state machine is adapted such that the feedback signals are provided based on the description of the state machine feedback function calculated by the generator.

22. The system according to claim 21, wherein the system is adapted to provide at least two feedback signals based on at least two different states of the registers of the state machine.

23. A system for generating a pseudo-random word stream, each word of the word stream comprising a plurality of subsequent bits of a pseudo-random bit sequence, the system comprising:
a state machine including,
a plurality of clocked registers, the registers comprising, corresponding inputs and corresponding outputs;
a feedback circuit coupled to the inputs and to the outputs of the registers and adapted to provide a plurality of feedback signals to the inputs of the registers based on a feedback function and the plurality of register output signals of the registers, the register output signals being indicative of states of the registers,
wherein the state machine is configured such that a first word defined by the plurality of register output signals comprises a first set of subsequent bits of the pseudo-random bit stream and such that a subsequent second word defined by the plurality of register output signals comprises a second set of subsequent bits of the pseudo-random bit stream; and
a circuit to provide a word of the pseudo-random bit stream in a sequentially encoded form; and
a generator for generating a description of a state machine feedback function on the basis of a set of generator polynomial coefficients defining a configuration of a linear feedback shift register, the generator including:
a calculator configured to calculate the description of the state machine feedback function for a state machine on the basis of the set of generator polynomial coefficients,
wherein the calculator is configured to determine the feedback function such that a state transition between immediately subsequent states of the state machine defined by the feedback function corresponds to a sequence of state transitions of a linear feedback shift register, the linear feedback, shift register being configured in accordance with the generator polynomial coefficients;
wherein the calculator is configured to acquire, as an intermediate result, a single transition matrix description of a state machine feedback function on the basis of the generator polynomial coefficients of the linear feedback shift register, the single transition matrix description describing a relationship between an initial state of a state machine and a consecutive state of the state machine according to the generator polynomial coefficients for a single linear feedback shift register state transition;
wherein the calculator is configured to compute a power of the single transition matrix description to acquire, as the state machine feedback function, a multi-transition matrix description describing, in a combined form, a plurality of linear feedback shift register state transitions; and
wherein the calculator is adapted to calculate the multi-transition matrix description A comprising the multi-transition matrix elements $A_{ij}$ based on the equation $$A = T^R \bmod 2$$

wherein T is the single transition matrix description comprising the single transition matrix elements $T_{ij}$, wherein i is a row index in the range between 1 and G, wherein j is a column index in the range between 1 and G, wherein N is a number of registers of the linear feedback shift register, wherein R is an integer larger than N, wherein G is an integer larger than or equal to a maximum of N and R, wherein $T_{ij}$ for j in the range between 1 and N is equal to the set of generator polynomial coefficients, wherein $T_{ij}$ for i=j+1 and j in the range between 1 and (G−1) is equal to 1, and wherein $T_{ij}$ is equal to 0, wherein the feedback circuit of the state machine is adapted such that the feedback signals are provided based on the description of the state machine feedback function calculated by the generator.

\* \* \* \* \*